US011480593B1

(12) United States Patent
Sterzbach et al.

(10) Patent No.: US 11,480,593 B1
(45) Date of Patent: Oct. 25, 2022

(54) MEASUREMENT SYSTEM AND METHOD OF DETERMINING AN ENERGY USAGE PARAMETER OF AN ELECTRONIC DEVICE UNDER TEST

(71) Applicant: Rohde & Schwarz GmbH & Co KG, Munich (DE)

(72) Inventors: Bernhard Sterzbach, Munich (DE); Byron-Lim Timothy Steffan, Munich (DE); Andreas Dippon, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/389,703

(22) Filed: Jul. 30, 2021

(51) Int. Cl.
*G01R 1/44* (2006.01)
*G01R 21/02* (2006.01)
*G01R 29/10* (2006.01)
*G01R 29/08* (2006.01)
*G01R 21/133* (2006.01)

(52) U.S. Cl.
CPC ........... *G01R 21/02* (2013.01); *G01R 21/133* (2013.01); *G01R 29/0864* (2013.01); *G01R 29/105* (2013.01)

(58) Field of Classification Search
CPC .... G01R 21/02; G01R 21/133; G01R 29/105; G01R 29/0864; G01R 31/2862; G01R 31/2875; G01R 31/2642; G01R 31/2872; G01R 31/2874
See application file for complete search history.

(56) References Cited

U.S. PATENT DOCUMENTS

| | | | | |
|---|---|---|---|---|
| 6,476,627 B1* | 11/2002 | Pelissier | ............ | G01R 31/2874 219/209 |
| 6,549,026 B1* | 4/2003 | DiBattista | .......... | G01R 31/2874 324/750.09 |
| 2003/0001605 A1 | 1/2003 | Jones et al. | | |
| 2006/0164111 A1* | 7/2006 | Lopez | ................ | G01R 31/2891 374/E7.043 |
| 2011/0095777 A1* | 4/2011 | Komoto | ............. | G01R 31/2874 324/756.01 |

FOREIGN PATENT DOCUMENTS

EP 0837335 A1 4/1998

\* cited by examiner

*Primary Examiner* — Thang X Le
(74) *Attorney, Agent, or Firm* — Christensen O'Connor Johnson Kindness PLLC

(57) ABSTRACT

A measurement system for determining an energy usage parameter of an electronic device under test is described. The measurement system includes a thermal chamber and an analysis circuit. The thermal chamber includes a housing, a temperature regulator and a thermal control circuit. The housing encloses an interior space of the thermal chamber, wherein the interior space is configured to accommodate the device under test. The thermal control circuit is configured to control the temperature regulator to keep a temperature of the interior space at a predefined reference temperature. The thermal control circuit is configured to determine a power consumption of the temperature regulator, wherein the power consumption is associated with keeping the temperature of the interior space at the predefined reference temperature. The analysis circuit is configured to determine at least one energy usage parameter of the device under test based on the determined power consumption. Further, a method of determining an energy usage parameter of an electronic device under test is described.

20 Claims, 3 Drawing Sheets

MEASUREMENT SYSTEM AND METHOD OF DETERMINING AN ENERGY USAGE PARAMETER OF AN ELECTRONIC DEVICE UNDER TEST

FIELD OF THE DISCLOSURE

Embodiments of the present disclosure generally relate to a measurement system for determining an energy usage parameter of an electronic device under test. Embodiments of the present disclosure further relate to a method of determining an energy usage parameter of an electronic device under test by a measurement system.

BACKGROUND

Measurement systems for testing properties of electronic devices under test are known in the state of the art. Usually, there are two different types of measurements that are performed on the device under test.

In a first type of measurements, the device under test is subjected to an external stimulus signal and the response of the device under test (tethered or wireless) is measured. In a second type of measurement, the device under test generates a tethered or wireless signal, which is received and analyzed by the measurement system.

An analysis circuit analyzes the response signal of the device under test and/or the signal generated by the device under test in order to assess whether the device under test is working correctly.

However, in some situations, it may be advantageous to additionally determine other properties of the device under test in order to check whether the device under test is working correctly. For example, it may be advantageous to determine a thermal radiation power of the device under test.

Thus, there is a need for a measurement system as well as a method that allow for determining a thermal radiation power of an electronic device under test.

SUMMARY

Embodiments of the present disclosure provide a measurement system for determining an energy usage parameter of an electronic device under test. In an embodiment, the measurement system comprises a thermal chamber and an analysis circuit. The thermal chamber comprises a housing, a temperature regulator and a thermal control circuit. The housing encloses an interior space of the thermal chamber, wherein the interior space is configured to accommodate the device under test. The thermal control circuit is configured to control the temperature regulator to keep a temperature of the interior space at a predefined reference temperature. The thermal control circuit is configured to determine a power consumption of the temperature regulator, wherein the power consumption is associated with keeping the temperature of the interior space at the predefined reference temperature. The analysis circuit is configured to determine at least one energy usage parameter of the device under test based on the determined power consumption.

The measurement system according to the present disclosure is based on the idea that unwanted power losses, for example electric losses, of the device under test usually manifest as heat dissipated by the device under test. The more heat the device under test dissipates into the interior space, the more power is necessary for the temperature regulator to keep the interior of the thermal chamber at the predefined reference temperature.

The power consumption of the temperature regulator is a direct measure for heat dissipated by the device under test, and thus a direct measure for power losses of the device under test.

Accordingly, the at least one energy usage parameter is associated with or rather correlated with the heat dissipated into the interior space by the device under test.

Thus, additional information about the device under test, namely information about power losses of the device under test, are provided by the measurement system according to the present disclosure, namely in form of the at least one energy usage parameter.

Accordingly, additional aspects of the performance of the device under test can be tested and/or already tested aspects of the performance of the device under test can be supplemented with the additional information about the power losses of the device under test.

The analysis circuit may be configured to compare an actual power consumption of the temperature regulator with a reference power consumption of the temperature regulator. The reference power consumption may relate to keeping the interior space at the predefined reference temperature when the interior space is empty, i.e. without any device under test in the interior space. Alternatively or additionally, the reference power consumption may relate to keeping the interior space at the predefined reference temperature when the device under test is not powered and/or when the device under test is in thermal equilibrium with the interior space, such that no heat is dissipated from the device under test into the interior space or vice versa. A difference between the actual power consumption and the reference power consumption is associated with additional heat dissipated into the interior space by the device under test.

According to an aspect of the present disclosure, the at least one energy usage parameter comprises at least one of a total power consumption of the device under test, a heat loss associated with the device under test, a usable power portion of the device under test, or a power efficiency of the device under test. Therein, the term "usable power portion" is understood to denote the fraction of the total power consumption of the device under test that is actually used for performing the tasks that the device under test is configured to perform, i.e., for processing signals and/or generating signals. The term "power efficiency" is understood to denote the ratio of the usable power portion and the total power consumption of the device under test.

The determined power consumption of the temperature regulator may be combined with at least one further parameter of the measurement system that is associated with the power consumption of the device under test in order to determine the at least one energy usage parameter.

For example, if the device under test is powered by the measurement system via an electric cable, the electric power supplied to the device under test may be measured.

As another example, a total radiated power of the device under test may be measured if the device under test is configured to generate a wireless electromagnetic signal.

As another example, the power of an electric signal generated by the device under test may be measured.

According to another aspect of the present disclosure, the housing comprises at least one sealable opening for supplying cold air or hot air to the interior space. Therein and in the following, the term "cold air" is understood to denote air having a temperature that is lower than the temperature of the interior space. Moreover, the term "hot air" is understood to denote air having a temperature that is higher than the temperature of the interior space.

Thus, the temperature of the interior space may at least partially be controlled by supplying air that is colder than the interior space into the interior space. Alternatively or additionally, the temperature of the interior may at least partially be controlled by supplying air that is hotter than the interior space into the interior space.

Accordingly, the temperature regulator may comprise a cooling unit that is configured to generate cold air. The cooling unit may be coupled to the at least one sealable opening.

Alternatively or additionally, the temperature regulator may comprise a heating unit that is configured to generate hot air. The heating unit may be coupled to the at least one sealable opening.

In an embodiment of the present disclosure, the thermal chamber comprises an internal temperature sensor, wherein the internal temperature sensor is configured to sense an actual internal temperature of the interior space. The sensed actual internal temperature may be forwarded to the thermal control circuit and/or the analysis circuit. The thermal control circuit may be configured to adapt the power supplied to the temperature regulator based on the sensed actual internal temperature, for example based on a deviation of the sensed actual internal temperature from the predefined reference temperature.

In a further embodiment of the present disclosure, the analysis circuit is configured to determine the at least one energy usage parameter of the device under test based on the sensed actual internal temperature of the interior space. In other words, the sensed actual internal temperature serves as an additional parameter for determining the at least one energy usage parameter.

According to another aspect of the present disclosure, the thermal chamber comprises an external temperature sensor, wherein the external temperature sensor is configured to sense an actual external temperature of an immediate environment of the housing. The sensed actual external temperature may be forwarded to the thermal control circuit and/or to the analysis circuit. The thermal control circuit may be configured to adapt the power supplied to the temperature regulator based on the sensed actual external temperature.

In general, the actual external temperature or rather the difference between the actual external temperature and the actual internal temperature determines the amount of heat transported from the environment of the thermal chamber into the interior space or vice versa via thermal conduction.

In some embodiments, the analysis circuit is configured to determine the at least one energy usage parameter of the device under test based on the sensed actual external temperature. For example, the power consumption of the temperature regulator may be corrected for the heat flowing into or out of the thermal chamber by thermal conduction based on the sensed actual external temperature.

In an embodiment of the present disclosure, the thermal chamber comprises an internal temperature sensor, wherein the internal temperature sensor is configured to sense an actual internal temperature of the interior space, and wherein the analysis circuit is configured to determine the at least one energy usage parameter of the device under test based on a difference between the external temperature and the internal temperature.

The difference between the actual external temperature and the actual internal temperature determines the amount of heat transported from the environment of the thermal chamber into the interior space or vice versa via thermal conduction.

For example, the power consumption of the temperature regulator may be corrected for the heat flowing into or out of the thermal chamber by thermal conduction based on the determined difference between the external temperature and the internal temperature.

According to an aspect of the present disclosure, the predefined temperature varies over time. Thus, instead of keeping the interior at the same temperature, the thermal control circuit may be configured to control the temperature regulator such that the temperature of the interior space follows a predetermined temperature curve.

Due to the heat dissipation of the device under test, the power consumption of the temperature regulator for following the predetermined temperature curve will deviate from the power consumption of the temperature regulator for following the predetermined temperature curve when no device under test is present in the interior space. As already described above, the analysis circuit may be configured to determine the at least one energy usage parameter of the device under test based on that deviation.

In some embodiments, the housing is transparent for electromagnetic waves in a predetermined frequency range. The predetermined frequency range may be associated with an operating range of the device under test, i.e., a frequency range in which the device under test is configured to receive and/or transmit electromagnetic waves. Thus, RF measurements are not obstructed by the thermal chamber.

According to another aspect of the present disclosure, the measurement system further comprises an RF test chamber, wherein the thermal chamber is arranged in the RF test chamber. The RF test chamber may comprise antennas and/or other RF equipment that is configured to perform over-the-air (OTA) tests on the device under test, for example an RF analysis circuit being configured to analyze electromagnetic signals generated by the device under test. The RF analysis circuit may be integrated into the analysis circuit.

The thermal chamber does not obstruct the OTA tests performed by the RF test chamber, as the housing of the thermal chamber is transparent at least in the relevant frequency operating range of the device under test and/or the relevant frequency operating range of the RF test chamber.

In a further embodiment of the present disclosure, the RF test chamber comprises an anechoic chamber. The device under test may be arranged in the thermal chamber, and the thermal chamber may be arranged in the anechoic chamber.

The anechoic chamber may be covered internally with RF absorbing material to reduce or even eliminate interferences disturbing the OTA measurements.

In some embodiments, the RF test chamber is configured to determine at least one RF emission parameter of the device under test, wherein the RF emission parameter is associated with RF waves emitted by the device under test. For example, the at least one RF emission parameter may be associated with at least one of a total radiated power, a spatial distribution of a power of the radiated RF waves, or a frequency spectrum of the RF waves.

According to an aspect of the present disclosure, the analysis circuit comprises a machine-learning circuit, wherein the machine-learning circuit is trained to determine the at least one energy usage parameter of the device under test based on the determined power consumption of the temperature regulator. Accordingly, even an unexperienced user may operate the measurement system, as the machine-learning circuit may automatically determine the at least one energy usage parameter.

In some embodiments, the machine-learning circuit may be trained to determine the at least one energy usage parameter based on the determined power consumption and on at least one additional parameter of the measurement system. Thus, the measurement system is even easier to operate, as the machine-learning circuit may automatically take further parameters of the measurement system into account in order to correctly determine the at least one energy usage parameter.

For example, the at least one further parameter may be the actual internal temperature of the interior space, the actual external temperature of the environment of the thermal chamber, a temperature difference between the actual internal temperature and the actual external temperature, a total electric power supplied to the device under test, and/or a total power of RF waves emitted by the device under test.

The machine-learning circuit may comprise an artificial neural network. Accordingly, the artificial neural network may be trained to determine the at least one energy usage parameter based on the determined power consumption. Optionally, the artificial neural network may be trained to determine the at least one energy usage parameter based on the determined power consumption and the at least one further parameter of the measurement system described above.

According to another aspect of the present disclosure, the machine-learning circuit is trained by placing a heater having known thermal emissions into the interior space of the thermal chamber. The heater dissipates a known amount of heat into the interior space of the thermal chamber. Accordingly, the determined power consumption of the temperature regulator can be linked to the known amount of heat dissipated by the heater. In some embodiments, the power consumption of the temperature regulator may be determined for several different power settings of the heater, i.e., for different heating powers of the heater.

Additionally or alternatively, the power consumption of the temperature regulator may be determined for different sets of further parameters of the measurement system, such that the machine-learning circuit is trained to correctly take these further parameters into account for determining the at least one energy usage parameter.

For the training of the machine-learning circuit, the determined power consumption of the temperature regulator and, optionally, the at least one further parameter of the measurement system serve as input parameters, i.e., as training data for the machine-learning circuit.

The training data may be labeled or unlabeled training data. If the training data is labeled training data, the training data may comprise at least one actual energy usage parameter associated with the respective determined power consumption of the temperature regulator and, optionally, the at least one further parameter of the measurement system.

The least one energy usage parameter is the output parameter of the machine-learning circuit. The at least one determined energy usage parameter may be compared to the at least one actual energy usage parameter of the device under test, for example if the training data comprises the at least one actual energy usage parameter (i.e., if the training data is labeled training data).

In an embodiment of the present disclosure, the measurement system comprises an electronic device under test being arranged in the interior space of the thermal chamber. As already described above, the device under test is an electronic device that is configured to generate and/or receive electric signals and/or RF signals.

Embodiments of the present disclosure further provide a method of determining an energy usage parameter of an electronic device under test by a measurement system. The measurement system comprises a thermal chamber and an analysis circuit. The thermal chamber comprises a housing, a temperature regulator and a thermal control circuit, wherein the housing encloses an interior space of the thermal chamber. The interior space is configured to accommodate the device under test. In an embodiment, The method comprises the following steps:

providing an electronic device under test in the interior space of the thermal chamber;

powering the device under test;

keeping an internal temperature of the internal space at a predefined reference temperature by the temperature regulator that is controlled by the thermal control circuit;

determining a power consumption of the temperature regulator, wherein the power consumption is associated with keeping the temperature of the interior space at the predefined reference temperature; and determining at least one energy usage parameter of the device under test based on the determined power consumption.

In some embodiments, the measurement system described above is configured to perform the method of determining an energy usage parameter of an electronic device under test.

Regarding the advantages and further properties of the method, reference is made to the explanations given above with respect to the measurement system, which also hold for the measurement system and vice versa.

According to an aspect of present disclosure, the thermal chamber is arranged in an RF test chamber, and wherein at least one RF emission parameter of the device under test is determined by the RF test chamber, wherein the RF emission parameter is associated with RF waves emitted by the device under test. The RF test chamber may comprise antennas and/or other RF equipment that is configured to perform over-the-air (OTA) tests on the device under test, for example an RF analysis circuit being configured to analyze electromagnetic signals generated by the device under test.

The thermal chamber does not obstruct the OTA tests performed by the RF test chamber, as the housing of the thermal chamber is transparent at least in the relevant frequency operating range of the device under test and/or the relevant frequency operating range of the RF test chamber.

According to another aspect of the present disclosure, the at least one energy usage parameter comprises at least one of a total power consumption of the device under test, a heat loss associated with the device under test, a usable power portion of the device under test, or a power efficiency of the device under test. Therein, the term "usable power portion" is understood to denote the fraction of the total power consumption of the device under test that is actually used for performing the tasks that the device under test is configured to perform, i.e. for processing signals and/or generating signals. The term "power efficiency" is understood to denote the ratio of the usable power portion and the total power consumption of the device under test.

The determined power consumption of the temperature regulator may be combined with at least one further parameter of the measurement system that is associated with the power consumption of the device under test in order to determine the at least one energy usage parameter.

For example, if the device under test is powered by the measurement system via an electric cable, the electric power supplied to the device under test may be measured.

As another example, a total radiated power of the device under test may be measured if the device under test is configured to generate a wireless electromagnetic signal.

As another example, the power of an electric signal generated by the device under test may be measured.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
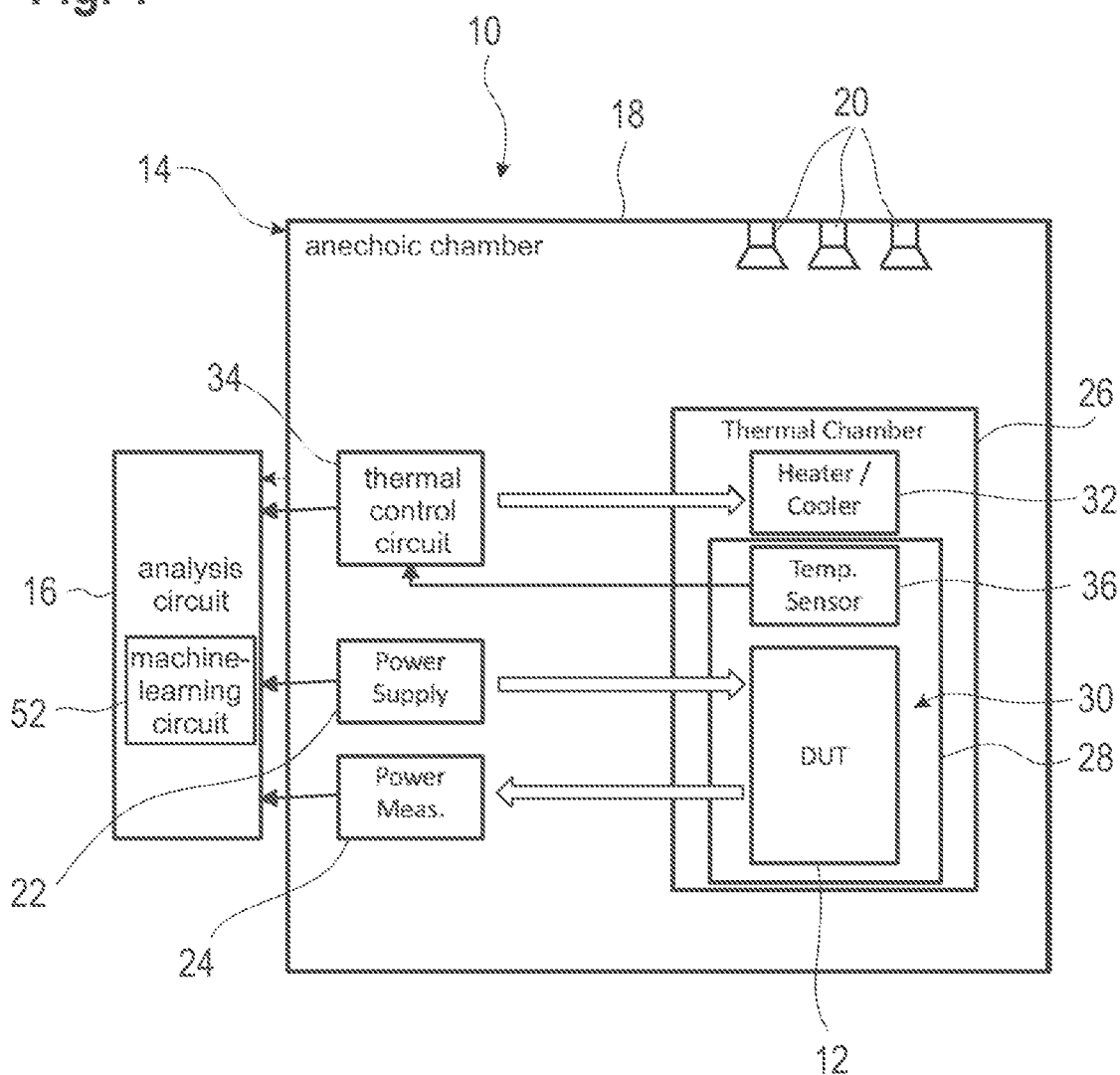
FIG. 1 schematically shows a block diagram of a measurement system according to an embodiment of the present disclosure.

FIG. 1 schematically shows a measurement system 10. The measurement system is established as an over-the-air test system for measuring the radiation performance of an electronic device under test 12. In the embodiment shown, the measurement system 10 comprises an RF test chamber 14 and an analysis circuit 16 that is connected to the RF test chamber 14 in a signal-transmitting manner.

Therein and in the following, the term "connected in a signal-transmitting manner" is understood to denote a cable-based or wireless connection that is configured to transmit signals between the respective devices or components.

In general, the RF test chamber 14 is established as an over-the-air test chamber that comprises all the necessary equipment for performing OTA measurements on the device under test 12. The RF test chamber 14 comprises an anechoic chamber 18. The anechoic chamber 18 may be covered internally with RF absorbing material to reduce or even eliminate interferences disturbing the OTA measurements.

Within the anechoic chamber 18, at least one measurement antenna 20 is arranged, for example several measurement antennas 20. The at least one measurement antenna 20 is configured to transmit RF waves into the anechoic chamber 18, such that the device under test 12 is subjected to the transmitted RF waves. Alternatively or additionally, the at least one measurement antenna 20 is configured to receive RF waves generated and transmitted by the device under test 12.

The RF test chamber 14 further comprises a power supply 22 and a power measurement unit 24. The power supply 22 is configured to supply the device under test 12 with electric power. The power measurement unit 24 is configured to measure the electric power supplied to the device under test 12 and/or the electric power of a tethered signal generated by the device under test 12. In an embodiment, the power measurement unit 24 includes at least one measurement circuit configured to measure the electric power supplied to the device under test 12 and/or the electric power of a tethered signal generated by the device under test 12

The measurement system 10 further comprises a thermal chamber 26. The thermal chamber comprises a housing 28 that encloses an interior space 30 of the thermal chamber 26.

The thermal chamber 26 comprises a temperature regulator 32, a thermal control circuit 34, and at least one temperature sensor 36. It is noted that while the thermal control circuit 34 is depicted as being established separately from the thermal chamber 26, the thermal control circuit 34 may also be established integral with the thermal chamber 26. In some embodiments, the thermal control circuit 34 may be located inside the anechoic chamber 18 or outside of the anechoic chamber 18.

Figure 2:
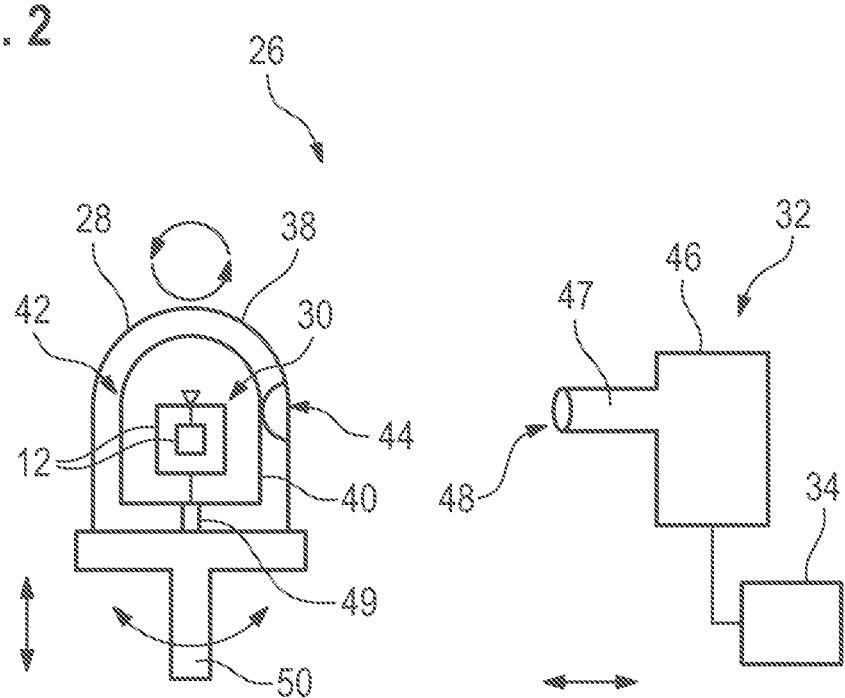
FIG. 2 shows a thermal chamber of the measurement system of FIG. 1 in a first operational mode.

FIG. 2 shows the thermal chamber 26 in more detail. In the shown embodiment, the housing 28 comprises a first outer layer 38 as well as a second inner layer 40 wherein both layers 38, 40 are spaced apart from each other such that an air gap 42 is established between both layers. The air gap 42 may be used for insulation purposes as will be described in more detail hereinafter.

In addition, the second inner layer 40 may be established by an inflatable layer such that the inner layer 40 is configured to adapt its shape when it is inflated, in particular when the pressure within the interior space 30 of the housing 28 increases. Thus, the inner layer 40 may expand into the air gap 42 provided between both layers 38, 40 when the associated space is inflated. Accordingly, the inner layer 40 corresponds to a balloon-like layer.

In addition, the housing 28 is generally configured such that a gap is provided between the device under test 12 and the inner surface of the housing 28 being defined by the inner surface of the inner layer 40 in this embodiment. This gap is part of the interior space 30 that is used for accommodating the device under test 12. In general, the gap ensures that the inner surface of the housing 28, in particular the one of the inner layer 40, does not directly contact the device under test 12.

The housing 28 may also have at least one sealable opening 44 that may establish a connection between the interior space 30 and the outer circumference of the housing 28 when the sealable opening 44 is opened such that the atmosphere (ambient condition) within the interior space 30 can be adapted appropriately via the sealable opening 44. Hence, the sealable opening 44 establishes an interface for adapting the atmosphere of the interior space 30 as will be described later.

For adapting the atmosphere within the interior space 30, the thermal chamber 26 comprises the temperature regulator 32 that is shown in FIG. 2 on the right hand side. As is shown in FIG. 2, the temperature regulator 32 may not be connected with the housing 28 when the measurement system 10 is in a certain testing operation mode. However, the temperature regulator 32 may be connected with the housing 28 for adapting the atmosphere within the interior space 30 appropriately in another operation mode of the measurement system 10, namely in the operation mode described below. Hence, the temperature regulator 32 is generally configured to adapt the atmosphere within the interior space 30 when it is connected to the housing 28 via the sealable opening 44.

As shown in FIG. 2, the temperature regulator 32 comprises the thermal control circuit 34 that is connected to a blowing, cooling and/or heating unit 46 which in turn is connected to a piping system 47 having an interface 48 to be connected with the at least one sealable opening 44 for adapting the atmosphere within the interior space 30. The blowing, cooling and/or heating unit 46 may be established by at least two different sub-units, for instance a blower and a temperature conditioning sub-unit. In some embodiments, the blowing, cooling and/or heating unit 46 may include heater circuits, cooling circuits, etc., which include, for example, HVAC components such as compressors, evaporators, heating elements, combustion elements, heat exchangers, fans, blowers, etc.

Generally, the temperature regulator 32 may be configured to adapt the pressure and/or temperature within the interior space 30 by guiding air via the piping system 47.

For instance, air is guided from the environment into the interior space 30 or air is sucked from the interior space 30 and guided to the environment. In other words, the interior space 30 may be inflated and/or deflated. Hence, the thermal control circuit 34 may also control the direction of the air stream as well as the pressure within the interior space 30 appropriately.

The temperature of the atmosphere within the interior space 30 may also be controlled by the thermal control circuit 34 indirectly as the thermal control circuit 34 controls the cooling and/or heating unit 46 of the temperature regulator 32 appropriately.

Generally, the housing 28 may comprise several sealable openings 44 that might be configured to process an air stream only in one direction, namely an air stream into the interior space 30 or from the interior space 30 to the environment. For this purpose, the respective sealable opening 44 may comprise a check valve. However, the at least one sealable opening 44 may also be configured to permit gas flow in both directions such that the gas exchange may be established via the at least one sealable opening 44.

For powering the device under test 12, namely during the testing, an interface panel 49 is provided that is assigned to the interior space 30 and the outer space of the housing 28 such that (cable) connections or the like between the device under test 12 and periphery devices of the measurement system 10 can be established via the interface panel 49. The periphery devices may be power sources and/or signal sources, for example the power supply 22 and/or the power measurement unit 24. Hence, the interface panel 49 may have connectors and/or sockets for cables, signal cables, power cables, fiber optics and/or radio frequency connectors wherein these members may be used for controlling purposes and/or signal pass-throughs. The interface panel 49 may be part of the housing 28.

The measurement system 10 may also comprise a positioning unit 50 for the housing 28 that may be positioned on the positioning unit 50 in order to be moved or rotated appropriately for testing the radiation performances under different angles. For instance, the positioning unit 50 may be configured to perform three-dimensional movements (rotational, tilting, pivoting, swiveling and/or linear movements) which simplifies multiple-dimensional measurements of the radiation performances of the device under test 12 such as two- or three-dimensional measurements. In some embodiments, the positioning unit 50 includes one or more of XY table, a rotation table, linear and/or rotational stages, etc.

As shown in FIG. 2, the interface panel 49 is provided at the side of the housing 28 facing the positioning unit 50. For instance, the interface panel 49 and the positioning unit 50 may be established by a plug-in interface in a sealed manner, in particular a fixed one.

The whole housing 28 as well as the device under test 12 located therein may be positioned on the positioning unit 50 for being moved, rotated, swiveled, pivoted and/or tilted during the testing, in particular the testing scenario applied.

However, the positioning unit 50 may also comprise a platform defining a testing position for the device under test 12 wherein the platform passes through the housing 28 in a sealed manner such that only the platform and the device under test 12 is moved appropriately within the housing 28 that remains stationary in contrast thereto.

In general, the measurement system 10 may conduct OTA measurements on the device under test 12 in the operation mode of the thermal chamber 26 shown in FIG. 2, i.e., when the housing 28 is sealed off from the temperature regulator 32. In this case, the interior space 30 is brought to a predefined temperature by the temperature regulator 32, until the device under test 12 has reached a wanted testing temperature. Afterwards, the temperature regulator 32 is sealed off and the OTA measurements are conducted. This way, the device under test 12 can be tested under different temperature conditions.

Figure 3:
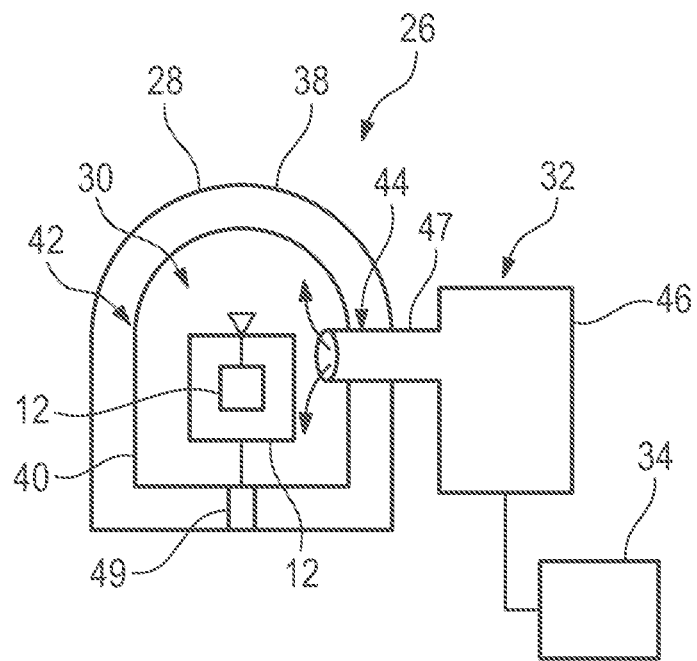
FIG. 3 shows the thermal chamber of FIG. 2 in a second operational mode.
Figure 4:
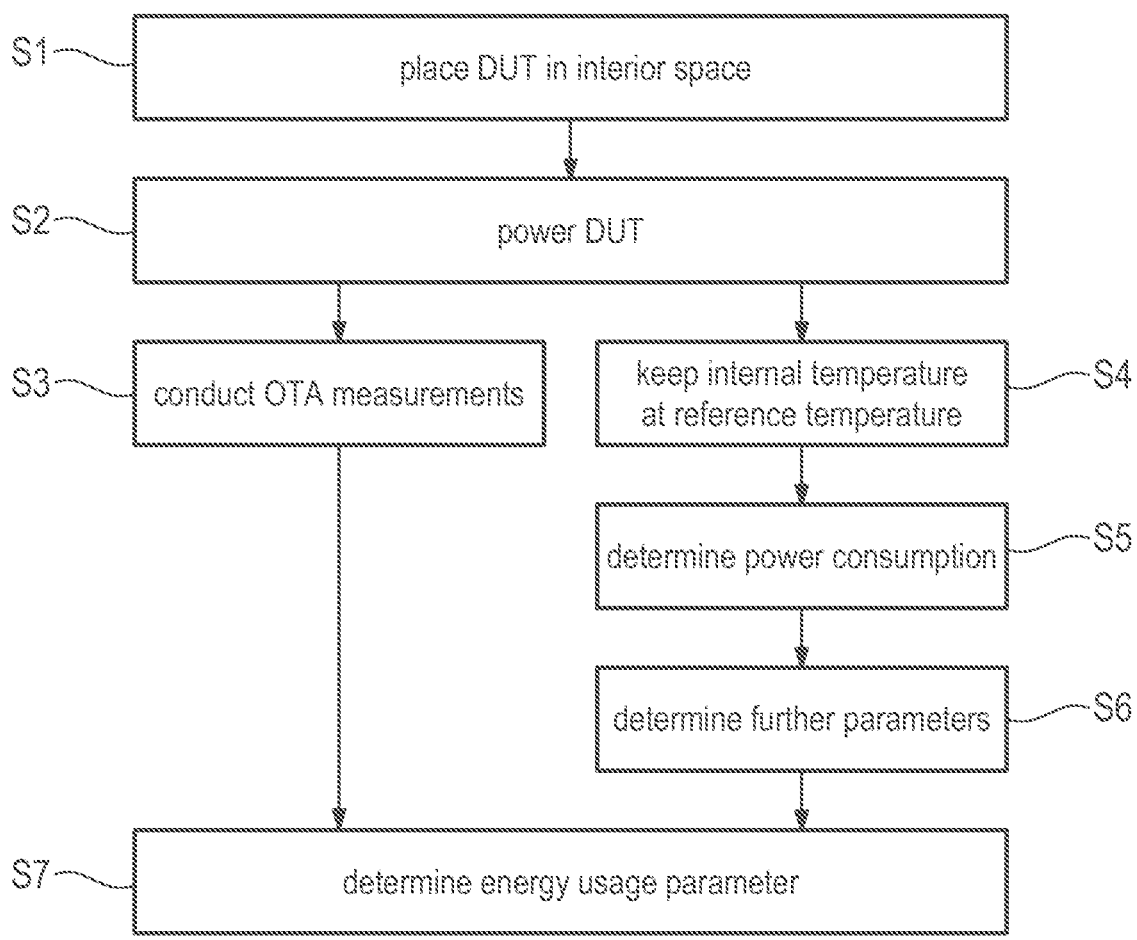
FIG. 4 shows a flow chart of a representative method of determining an energy usage parameter of an electronic device under test.

However, the measurement system is further configured to perform tests on the device under test 12 in the operation mode shown in FIG. 3, i.e., with the temperature regulator 32 connected to the housing 28 via the piping system 47. More precisely, the measurement system 10 is configured to perform a method of determining an energy usage parameter of the electronic device under test 12. A representative method is described in the following with reference to FIG. 4.

The device under test 12 is placed in the interior space 30 of the housing 28 (step S1). If necessary, the device under test 12 is connected to periphery devices of the measurement system 10 via the interface panel 49, for example to the power supply 22 and/or the power measurement unit 24.

The device under test 12 is powered (step S2). The device under test 12 may comprise a battery such that the device under test 12 is self-powered. Alternatively or additionally, the device under test 12 is powered by the power supply 22.

OTA measurements are conducted on the device under test 12 by the RF test chamber 14 in order to determine at least one RF emission parameter of the device under test 12 (step S3). In some embodiments, any type of RF measurement may be performed, for example a measurement of a total RF power radiated by the device under test 12 or of a power distribution of RF waves emitted by the device under test 12, or of a spectrum of the RF waves emitted by the device under test 12.

Accordingly, the at least one RF emission parameter may be associated with at least one of a total radiated power, a spatial distribution of a power of the radiated RF waves, and a frequency spectrum of the RF waves emitted by the device under test 12.

The housing 28 is transparent for electromagnetic waves in a predetermined frequency range, namely the frequency range used for the OTA measurements, such that the OTA measurements are not obstructed by the thermal chamber 26.

During the RF measurements, the internal temperature of the interior space 30 is kept at a predefined reference temperature by the temperature regulator 32 that is controlled by the thermal control circuit 34 (step S4).

For example, the actual internal temperature of the interior space 30 may be sensed by the at least one temperature sensor 36. The sensed actual internal temperature may be forwarded to the thermal control circuit 34. The thermal control circuit 34 may adapt the power supplied to the temperature regulator 32 based on the sensed actual internal temperature, for example based on a deviation of the sensed actual internal temperature from the predefined reference temperature. This way, the actual internal temperature may be controlled to match the predefined reference temperature.

The temperature of the interior space 30 may be controlled by supplying air that is colder than the interior space 30 into the interior space 30. Alternatively or additionally, the temperature of the interior space 30 may at least partially be controlled by supplying air that is hotter than the interior space 30 into the interior space 30.

It is noted that the atmosphere of the interior space 30 may be pre-conditioned by the temperature regulator 32 before starting the OTA measurements, such that the OTA measurements start with the interior space 30 and the device under test 12 having the predefined reference temperature.

It is noted that the predefined temperature may be constant or may vary over time. Thus, instead of keeping the interior space 30 at the same temperature, the thermal control circuit 34 may control the temperature regulator 32 such that the temperature of the interior space 30 follows a predetermined temperature curve.

The power consumption of the temperature regulator 32 is determined, wherein the power consumption is associated with keeping the temperature of the interior space at the predefined reference temperature (step S5). More precisely, the power consumption of the temperature regulator is determined by the thermal control circuit 34, for example via suitable current and/or voltage sensors.

Optionally, further parameters of the measurements system 10 are determined (step S6). For example, if the device under test 12 is powered by the measurement system 10 via an electric cable, the electric power supplied to the device under test 12 may be measured, e.g. by the power supply 22 or the power measurement unit 24. As another example, a total radiated power of the device under test 12 may be measured. As another example, the power of an electric signal generated by the device under test 12 may be measured, for example by the power measurement unit 24.

Alternatively or additionally, an actual external temperature of an immediate environment of the housing 28 may be sensed by the at least one temperature sensor 36.

Accordingly, the at least one further parameter may comprise the actual internal temperature of the interior space 30, the actual external temperature of the environment of the thermal chamber 26, a temperature difference between the actual internal temperature and the actual external temperature, a total electric power supplied to the device under test 12, and/or a total power of RF waves emitted by the device under test.

At least one energy usage parameter of the device under test 12 is determined by the analysis circuit 16 based on the determined power consumption of the temperature regulator 32 and, optionally, based on the at least one further parameter (step S7). The power consumption of the temperature regulator 32 is a direct measure for heat dissipated by the device under test 12, and thus a direct measure for power losses of the device under test 12.

Accordingly, the at least one energy usage parameter is associated with or rather correlated with the heat dissipated into the interior space by the device under test. The at least one energy usage parameter may comprise at least one of a total power consumption of the device under test 12, a heat loss associated with the device under test 12, a usable power portion of the device under test 12, and/or a power efficiency of the device under test 12.

Therein, the term "usable power portion" is understood to denote the fraction of the total power consumption of the device under test 12 that is actually used for performing the tasks that the device under test 12 is configured to perform, i.e., for processing signals and/or generating signals. The term "power efficiency" is understood to denote the ratio of the usable power portion and the total power consumption of the device under test 12.

The analysis circuit 16 may be configured to compare an actual power consumption of the temperature regulator 32 with a reference power consumption of the temperature regulator 32 in order to determine the at least one energy usage parameter.

Therein, the reference power consumption may relate to keeping the interior space 30 at the predefined reference temperature when the interior space 30 is empty, i.e., without any device under test in the interior space 30. Alternatively or additionally, the reference power consumption may relate to keeping the interior space 30 at the predefined reference temperature when the device under test 12 is not powered and/or when the device under test 12 is in thermal equilibrium with the interior space 30, such that no heat is dissipated from the device under test 12 into the interior space 30 or vice versa. A difference between the actual power consumption and the reference power consumption is associated with additional heat dissipated into the interior space 30 by the device under test 12.

The at least one energy usage parameter may be determined based on a difference between the sensed actual external temperature and the sensed actual internal temperature. The difference between the actual external temperature and the actual internal temperature determines the amount of heat transported from the environment of the thermal chamber 26 into the interior space 30 or vice versa via thermal conduction.

For example, the power consumption of the temperature regulator 32 may be corrected for the heat flowing into or out of the thermal chamber by thermal conduction based on the determined difference between the external temperature and the internal temperature.

The analysis circuit 16 may determine the at least one energy usage parameter by employing classical algorithms. Alternatively or additionally, the analysis circuit may comprise a machine-learning circuit 52 (FIG. 1), for example an artificial neural network, that is trained to determine the at least one energy usage parameter of the device under test 12 based on the determined power consumption of the temperature regulator 32 and, optionally, based on the at least one further parameter.

In the following, one example method of training the machine-learning circuit 52 is described. The machine-learning circuit may be trained by placing a heater having known thermal emissions into the interior space 30.

The heater dissipates a known amount of heat into the interior space 30 of the thermal chamber 26. Accordingly, the determined power consumption of the temperature regulator 32 can be linked to the known amount of heat dissipated by the heater. In some embodiments, the power consumption of the temperature regulator 32 may be determined for several different power settings of the heater, i.e. for different heating powers of the heater.

Alternatively or additionally, the power consumption of the temperature regulator 32 may be determined for different sets of further parameters of the measurement system 10, such that the machine-learning circuit 52 is trained to correctly take these further parameters into account for determining the at least one energy usage parameter.

For the training of the machine-learning circuit 52, the determined power consumption of the temperature regulator 32 and, optionally, the at least one further parameter of the measurement system 10 serve as input parameters, i.e., as training data for the machine-learning circuit 52.

The training data may be labeled or unlabeled training data. If the training data is labeled training data, the training data may comprise at least one actual energy usage parameter associated with the respective determined power consumption of the temperature regulator 32 and, optionally, the at least one further parameter of the measurement system 10.

The least one energy usage parameter is the output parameter of the machine-learning circuit 52. The at least one determined energy usage parameter may be compared to the at least one actual energy usage parameter of the device under test 12, for example if the training data comprises the at least one actual energy usage parameter (i.e., if the training data is labeled training data).

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for determining an energy usage parameter of an electronic device under test, comprising: a thermal chamber and an analysis circuit, the thermal chamber comprising a housing, a temperature regulator and a thermal control circuit,
   wherein the housing encloses an interior space of the thermal chamber, the interior space being configured to accommodate the device under test,
   wherein the thermal control circuit is configured to control the temperature regulator to keep a temperature of the interior space at a predefined reference temperature,
   wherein the thermal control circuit is configured to determine a power consumption of the temperature regulator, wherein the power consumption is associated with keeping the temperature of the interior space at the predefined reference temperature, and
   wherein the analysis circuit is configured to determine at least one energy usage parameter of the device under test based on the determined power consumption.

2. The measurement system of claim 1, wherein the at least one energy usage parameter comprises at least one of a total power consumption of the device under test, a heat loss associated with the device under test, a usable power portion of the device under test, or a power efficiency of the device under test.

3. The measurement system of claim 1, wherein the housing comprises at least one sealable opening for supplying cold air or hot air to the interior space.

4. The measurement system of claim 1, wherein the thermal chamber comprises an internal temperature sensor, wherein the internal temperature sensor is configured to sense an actual internal temperature of the interior space.

5. The measurement system of claim 4, wherein the analysis circuit is configured to determine the at least one energy usage parameter of the device under test based on the sensed actual internal temperature of the interior space.

6. The measurement system of claim 1, wherein the thermal chamber comprises an external temperature sensor, wherein the external temperature sensor is configured to sense an actual external temperature of an immediate environment of the housing.

7. The measurement system of claim 6, wherein the analysis circuit is configured to determine the at least one energy usage parameter of the device under test based on the sensed actual external temperature of the interior space.

8. The measurement system of claim 6, wherein the thermal chamber comprises an internal temperature sensor, wherein the internal temperature sensor is configured to sense an actual internal temperature of the interior space, and wherein the analysis circuit is configured to determine the at least one energy usage parameter of the device under test based on a difference between the external temperature and the internal temperature.

9. The measurement system of claim 1, wherein the predefined temperature varies over time.

10. The measurement system of claim 1, wherein the housing is transparent for electromagnetic waves in a predetermined frequency range.

11. The measurement system of claim 1, further comprising an RF test chamber, wherein the thermal chamber is arranged in the RF test chamber.

12. The measurement system of claim 11, wherein the RF test chamber comprises an anechoic chamber.

13. The measurement system of claim 11, wherein the RF test chamber is configured to determine at least one RF emission parameter of the device under test, wherein the RF emission parameter is associated with RF waves emitted by the device under test.

14. The measurement system of claim 1, wherein the analysis circuit comprises a machine-learning circuit, wherein the machine-learning circuit is trained to determine the at least one energy usage parameter of the device under test based on the determined power consumption of the temperature regulator.

15. The measurement system of claim 14, wherein the machine-learning circuit comprises an artificial neural network.

16. The measurement system of claim 14, wherein the machine-learning circuit is trained by placing a heater having known thermal emissions into the interior space of the thermal chamber.

17. The measurement system of claim 1, further comprising an electronic device under test being arranged in the interior space of the thermal chamber.

18. A method of determining an energy usage parameter of an electronic device under test by a measurement system, the measurement system comprising a thermal chamber and an analysis circuit, the thermal chamber comprising a housing, a temperature regulator and a thermal control circuit, wherein the housing encloses an interior space of the thermal chamber, the interior space being configured to accommodate the device under test, the method comprising:
    providing the electronic device under test in the interior space of the thermal chamber;
    powering the device under test;
    keeping an internal temperature of the interior space at a predefined reference temperature by the temperature regulator that is controlled by the thermal control circuit;
    determining a power consumption of the temperature regulator, wherein the power consumption is associated with keeping the temperature of the interior space at the predefined reference temperature; and
    determining at least one energy usage parameter of the device under test based on the determined power consumption.

19. The method of claim 18, wherein the thermal chamber is arranged in an RF test chamber, and wherein at least one RF emission parameter of the device under test is determined by the RF test chamber, wherein the RF emission parameter is associated with RF waves emitted by the device under test.

20. The method of claim 18, wherein the at least one energy usage parameter comprises at least one of a total power consumption of the device under test, a heat loss associated with the device under test, a usable power portion of the device under test, or a power efficiency of the device under test.

* * * * *